United States Patent [19]

Giordano

[11] Patent Number: 4,680,483
[45] Date of Patent: Jul. 14, 1987

[54] COMPARATOR CIRCUIT
[75] Inventor: Raymond L. Giordano, Raritan Township, Hunterdon County, N.J.
[73] Assignee: RCA Corporation, Somerville, N.J.
[21] Appl. No.: 834,387
[22] Filed: Feb. 28, 1986
[51] Int. Cl.$^4$ .................. H03K 5/24; H03K 17/16
[52] U.S. Cl. ....................... 307/355; 307/30; 307/39; 307/62; 307/253; 307/358; 307/573
[58] Field of Search ............... 307/355, 356, 253, 350, 307/358, 573, 39, 59, 62, 30; 361/6, 21, 30, 33, 58, 86, 90, 91, 92

[56] References Cited
U.S. PATENT DOCUMENTS
4,300,063 11/1981 Dunphy et al. ............... 307/355
4,446,385 5/1984 Orengo et al. ............... 307/355

Primary Examiner—John Zazworsky
Attorney, Agent, or Firm—Henry I. Schanzer; Birgit E. Morris; Stanley C. Corwin

[57] ABSTRACT

A comparator for sensing a small voltage differential at, or close to, the operating voltage rails includes first and second means for producing first and second currents and for producing a third current which is indicative of the difference between the first and second currents. The first current varies as a linear function of first (e.g. $V_{IN}$) and second (e.g. $V_O$) voltages, the amplitude of the first current being proportional to that one of said first and second voltage having the largest amplitude. The second current varies exponentially as a function of the difference between the first and second voltages. Comparator means embodying the invention are particularly useful in circuits where a transistor-switch couples an input voltage ($V_{IN}$) to an output terminal and the transistor-switch is to be turned-off when $V_{IN}$ drops below the voltage ($V_O$) at the output terminal. The comparator means of the invention includes means for sensing the input and output voltages, and for deriving currents indicative of the input and output voltage levels. When a current condition is produced indicative of $V_O$ being equal to, or greater than, $V_{IN}$, the transistor-switch means is turned-off decoupling the input voltage from the output terminal.

7 Claims, 4 Drawing Figures

COMPARATOR CIRCUIT

This invention relates to comparator circuitry and, in particular, to a comparator circuit for sensing a relatively small voltage differential at, or close to, one of the operating voltage rails.

In many applications it is desirable to have an electronic switch selectively couple a driving voltage source to a load. However, a problem exists where the voltage source is subject to very large transients as is the case in many automotive applications. For example, the nominal 12 volts supplied by a car battery and/or voltage regulator is subject to large positive and negative transients. Of particular interest in this application are the large negative transients which may cause the nominal voltage to go substantially below the 12 volt level and even negative (i.e. below zero volts). When the input voltage drops below a predetermined level it is necessary and/or desirable to isolate or decouple the load from the input voltage source to maintain proper operation of the load, to prevent damage to the load, or to prevent reverse current flow through the load.

However, significant problems exist in disabling the switch and in decoupling the output load from the input voltage source. For example, the switch may be a bipolar transistor which is designed to normally pass conventional current from a relatively positive voltage source into the load, when turned-on. But, it should be borne in mind that the transistor-switch is capable of conducting bidirectionally. Thus, whenever the relatively positive "input" voltage source goes negative relative to the "output" voltage across the load, the "turned-on" transistor-switch conducts current in a direction opposite to the one normally intended and passes conventional current from the load into the voltage source. Driving the load in the opposite direction to the one normally intended and/or causing current to flow in a reverse direction through the load and/or applying a reverse potential across the load may damage the load which the use of the transistor-switch was intended to prevent, or protect, against.

It is therefore desirable and/or necessary to sense when the driving voltage ($V_{IN}$) drops below the output voltage ($V_O$) applied to the load. Furthermore, to prevent current flow in the reverse direction it is preferable to sense when $V_{IN}$ is equal to $V_O$ as $V_{IN}$ goes below $V_O$. However, sensing a small voltage differential (e.g., when $V_{IN}$ is equal to $V_O$) at, or close to, the positive (or negative) voltage rail (e.g., $V_{IN}$ is the operating potential for the input and output circuit) is very difficult. The sensing problem is further aggravated when the driving voltage and its corresponding load voltage vary over a wide range extending, for example, from +3 volts to +16 volts.

Once the "fault" condition (i.e., when $V_{IN}$ is equal to or less than $V_O$) is sensed there still remains the problem of turning off the transistor-switch coupling $V_{IN}$ to $V_O$. Turning off the transistor-switch is problematic where the switch is required to have a very low ON-impedance to permit the passage of normally high currents between the source and the load. The problem of turning off the transistor-switch is further aggravated when the input voltage ($V_{IN}$) coupled to the load is, normally, very nearly equal to the voltage ($V_O$) applied to the load and it is desired and/or necessary to turn-off the switch whenever the level of $V_{IN}$ drops to a value equal to or less than $V_O$.

Circuits embodying the invention include comparator means for sensing a small voltage differential at, or close to, the operating voltage rails. The comparator means includes a first means for producing a first current which varies as a linear function of first (e.g. $V_{IN}$) and second (e.g. $V_O$) voltages, the amplitude of said first current being proportional to that one of said first and second voltage having the largest amplitude. The comparator means also includes means for producing a second current which varies exponentially as a function of the difference between the first and second voltages and means for summing the first and second currents and producing a third current which is indicative of the difference between the first and second currents.

Comparator means embodying the invention are particularly useful in circuits where a transistor-switch couples an input voltage ($V_{IN}$) to an output terminal and the transistor-switch is to be turned-off when $V_{IN}$ drops below the voltage ($V_O$) at the output terminal. The comparator means of the invention includes means for sensing the input and output voltages, and for deriving currents indicative of the input and output voltage levels. When a current condition is produced indicative of $V_O$ being equal to, or greater than, $V_{IN}$, the transistor-switch means is turned-off decoupling the input voltage from the outpput terminal. Thus, the transistor-switch turn-off problem is resolved using circuits embodying the invention by means comparing currents proportional to the input and output voltages and controlling the transistor-switch as a function of the comparison.

In the accompanying drawing, like reference characters denote like components; and FIG. 1 is a semi-schematic, semi-block diagram of a system embodying the invention;

Figure 1:
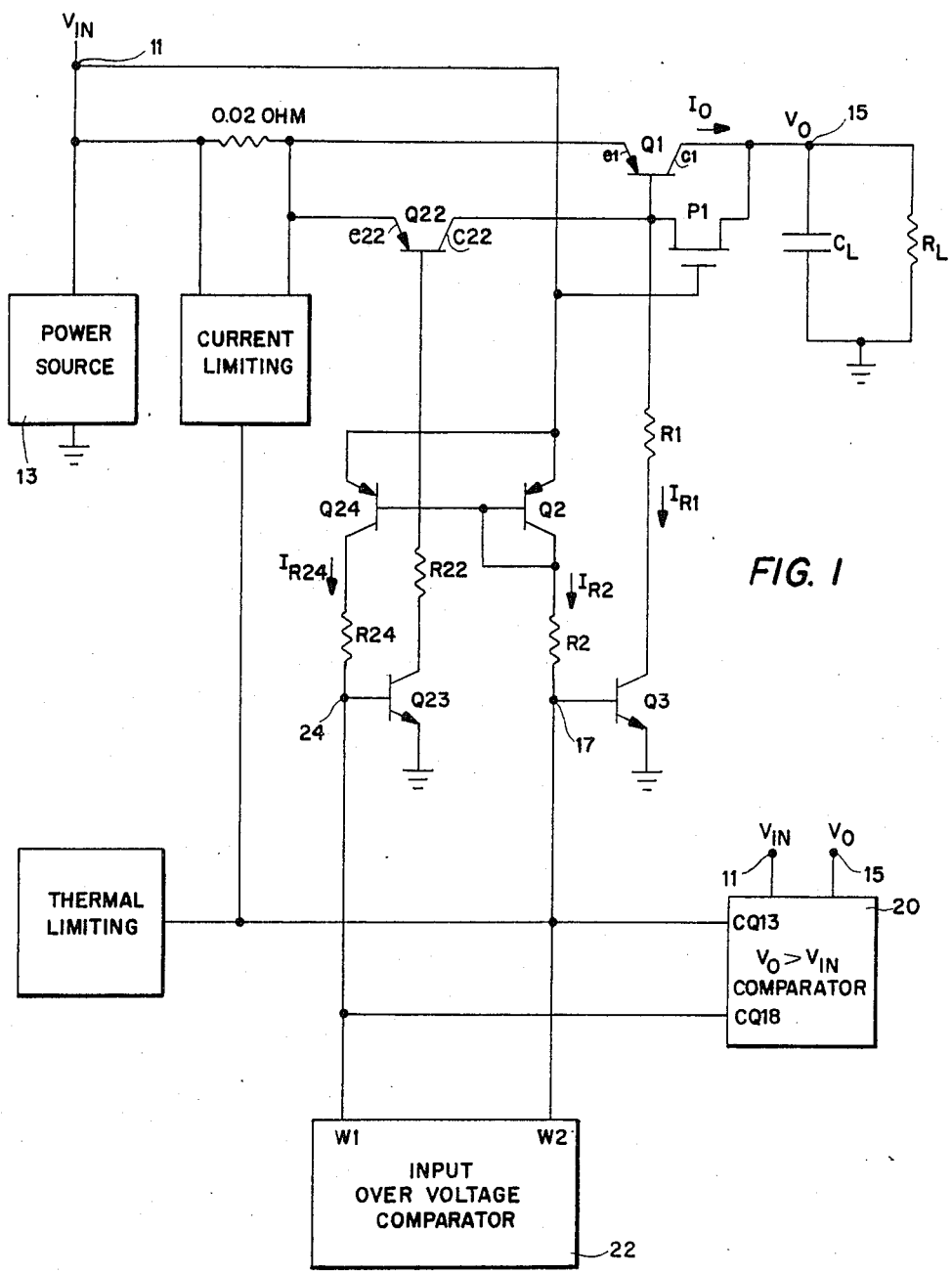

The circuit of FIG. 1 includes an input terminal 11 to which is applied a direct current (DC) voltage, $V_{IN}$, supplied by a power source 13 which may be, for example, a car battery. A PNP bipolar transistor, Q1, is connected at its emitter via a current limiting 0.02 ohm resistor to node 11 and at its collector to an output terminal 15 at which is produced an output voltage ($V_O$) and to which is connected a load to be powered by $V_{IN}$. The load is represented by a resistor RL across which is connected a filtering and energy storage capacity CL. However, it should be noted that the load RL may be any of a number of elements, (e.g. lamps, dc motors, integrated circuits (IC's) ... etc ... ) which are to be individually or simultaneously powered. Q1 is normally turned-on by means of a biasing circuit comprised of PNP transistor Q2, connected as a diode, resistors R1 and R2 and an NPN transistor Q3. Q2 is connected at its emitter to node 11 and at its base and collector to one end of resistor R2. The other end of resistor R2 is connected to terminal 17 to which is also connected the base of Q3. The emitter of Q3 is grounded and its collector is connected to one end of resistor R1 whose other end is connected to the base of Q1.

Under normal operating conditions, with $V_{IN}$ greater than $V_O$, whenever $V_{IN}$ is more positive than two $V_{BE}$ volts above ground, a current $I_{R2}$ flows via the emitter-tocollector path of Q2 and via resistor R2 into the base of Q3. Q3 can then draw a current $I_{R1}$ equal $\beta \cdot I_{R2}$ out of the base of Q1. Q1 can then produce an output current ($I_o$) into the load equal to its forward current gain times $I_{R1}$. Normally $V_{IN}$ is more positive than $V_O$ and, when Q1 is turned on, the voltage $V_{IN}$ at input terminal 11 is, typically, 0.1 to 0.8 volt more positive than the output voltage ($V_O$) at terminal 15.

The circuit of FIG. 1 includes a comparator 22 which senses whenever $V_{IN}$ exceeds a predetermined "safe" value (e.g. 16 volts) and circuitry responsive to the output signals W1 and W2 of comparator 22 for turning off Q1 when $V_{IN}$ exceeds the predetermined safe value. The turn-off circuit includes a PNP transistor Q22 having its emitter-to-collector path connected between the emitter and base of Q1. Q22 is connected at its base to one end of a resistor R22 whose other end is connected to the collector of NPN transistor Q23 whose emitter is grounded. The base drive for transistor Q23 is supplied by PNP transistor Q24 whose emitter is connected to $V_{IN}$, whose base is connected to the base of Q2, and whose collector is connected to one end of resistor R24 whose other end is connected to the base of Q23 at node 24. The current supplied by Q24 and into node 24 is thus proportional to the current $I_{R2}$. Nodes 24 and 17 are, respectively, connected to the W1 and W2 outputs of overvoltage comparator 22. The W1 output of comparator 22 is normally "low" clamping node 24 at, or close to, ground potential turning-off Q23 whereby Q22 is normally off. However, when $V_{IN}$ exceeds the prescribed limits W1 goes "high" enabling the turn-on of Q23 and Q22. Q22 then functions to clamp the emitter base of Q1 via its low on conduction path turning-off Q1. The W2 output of comparator 22 is normally "high" allowing $I_{R2}$ to flow into the base of Q3.

However, as discussed earlier, a problem exists when the voltage $V_{IN}$ applied to terminal 11 is, or goes, more negative than $V_O$ at terminal 15. When $V_0$ is more positive than $V_{IN}$, electrode e1 of Q1 which normally functions as the emitter of Q1 and electrode c1 of Q1 which normally functions as the collector of Q1 undergo a role reversal. Electrodes c1 and e1 then function as the emitter and collector, respectively, of Q1 and current flows from terminal 15 via the low impedance conduction path of Q1 into terminal 11. Thus, Q1, when turned-on, can conduct current from output terminal 15 into terminal 11 when $V_{IN}$ goes below $V_O$. Therefore, any negative transient may cause disruption in the operation of the load circuit and may damage the load, when the load is, for example, an integrated circuit or other load device designed to conduct safely in only one direction.

When $V_O$ exceeds $V_{IN}$ and electrode c1 of Q1 functions as the emitter of Q1, the base electrode of Q1 can go to a voltage equal to $V_O - V_{BE}$ volts. If $V_{IN}$ is sufficiently below $V_O$, electrode c22 of transistor Q22 also functions as an emitter electrode and Q22 (if not turned-off) can then function to pass current in the reverse direction from terminal 15 into terminal 11. It is therefore necessary to ensure that Q22 is also turned-off if, and when, Q1 is turned-off in response to $V_{IN}$ going below $V_O$.

The problem of turning-off Q1 (and Q22) is solved by sensing and comparing $V_{IN}$ and $V_O$ in a comparator 20. Whenever $V_{IN}$ goes below $V_O$, the normally turned-on Q1 is turned-off (by removing the base drive to Q1) thereby decoupling the load at terminal 15 from the voltage input at terminal 11. But, of course, as soon as $V_O$ has a value below $V_{IN}$, Q1 is again turned-on.

Figure 2:
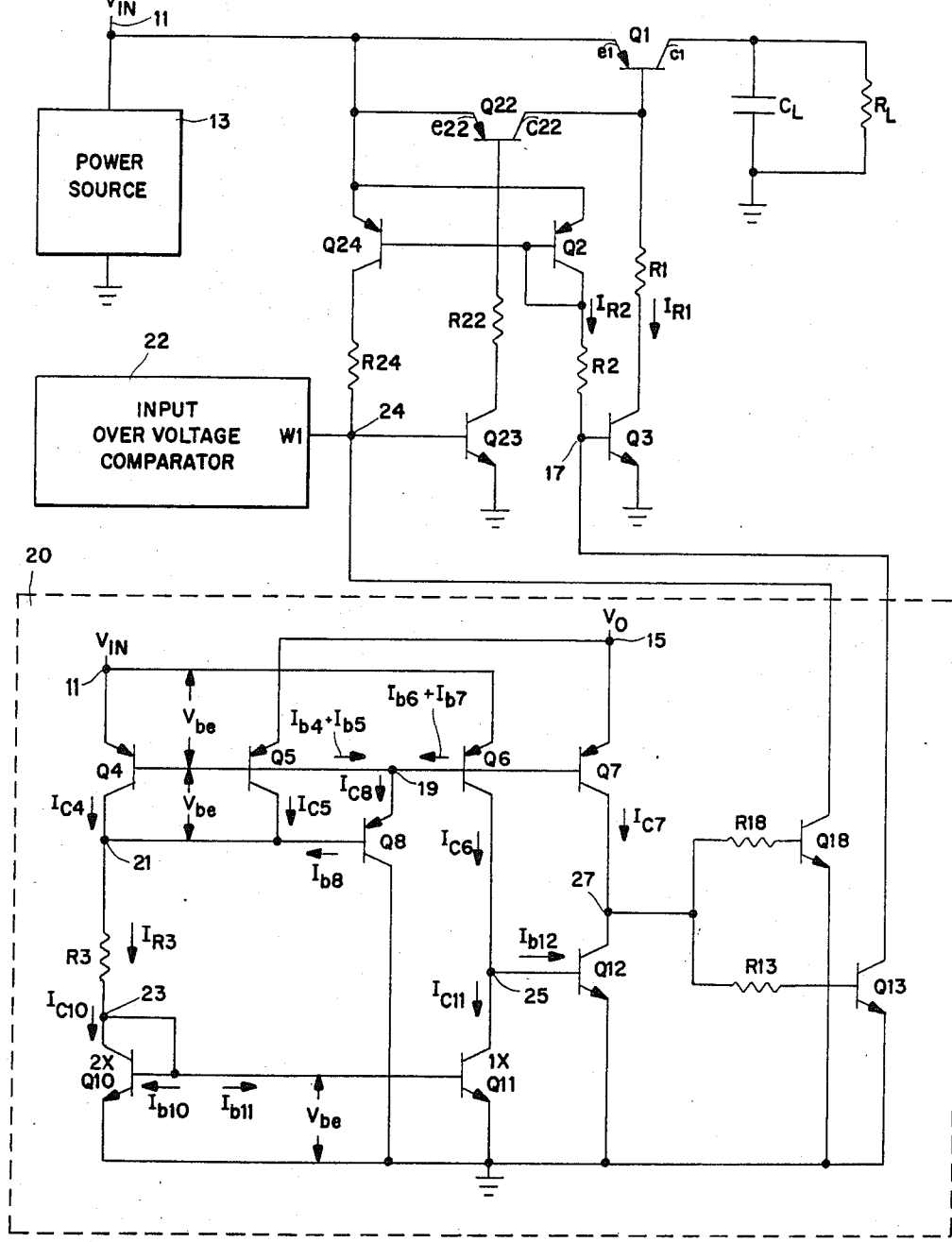
FIG. 2 is a schematic diagram of comparator circuitry embodying the invention.

A simplified schematic diagram of a comparator circuit 20 embodying the invention is shown schematically in FIG. 2. The circuit includes PNP bipolar transistors Q4 and Q6 connected at their emitters to terminal 11 and PNP bipolar transistors Q5 and Q7 connected at their emitters to terminal 15. Except where otherwise noted, it is assumed for ease of the discussion to follow that the transistors have equal forward current gains ($\beta$) [and have the same or similar characteristics]. The bases of Q4, Q5, Q6 and Q7 are connected to a common biasing node 19. A current biasing PNP bipolar transistor Q8 is connected at its emitter to node 19, at its base to node 21 and at its collector to ground. Q8 functions to conduct the base currents $I_{b4}$, $I_{b5}$, $I_{b6}$ and $I_{b7}$ out of the bases of Q4, Q5, Q6 and Q7, respectively, and to then return via its base connection a much smaller base current ($I_{b8}$) into node 21.

The collectors of Q4 and Q5 and the base of Q8 are connected to one end of resistor R3 at node 21. The other end of resistor R3 is connected to the collector and base of an NPN bipolar transistor Q10 and to the base of an NPN bipolar transistor Q11. Q10 and Q11 with their emitters returned to ground, are interconnected to function as a current mirror with collector of Q10 defining the input of the mirror and the collector of Q11 defining the output of the mirror. Q11 is made one-half the physical size of Q10, whereby for the same base-to-emitter potential, Q11 conducts one-half the collector current conducted by Q10. The collector of Q11 is connected to a current summing node 25 to which is also connected the collector of Q6 and the base of an NPN bipolar transistor Q12 whose emitter is grounded. The collectors of Q7 and Q12 are connected to node 27 which also functions as a current summing node. The bases of NPN bipolar transistors Q13 and Q18 are connected via resistors R13 and R18, respectively, to node 27. The emitters of Q13 and Q18 are grounded with the collector of Q13 being connected to node 17 and the collector of Q18 being connected to node 24.

The operation of the circuit of FIG. 2 will now be discussed for the condition when: (1) $V_{IN}$ is greater than $V_O$; (2) $V_O$ is greater than $V_{IN}$; and (3) $V_{IN}$ is equal to $V_O$.

For the condition when Q1 is turned-on and $V_{IN}$ at terminal 11 is greater than $V_O$ at terminal 15, the voltage (V19) at intermediate node 19 is at $V_{IN} - V_{BE}$ volts. For this condition, current conduction through Q4 and Q6 is greater than conduction through Q5 and Q7. For ease of illustration, assume that $V_{IN}$ is sufficiently greater than $V_O$ such that Q5 and Q7 are turned-off and Q4 and Q6 are turned-on. Under this condition, there is no collector current ($I_{c5}$) through Q5 and no collector current ($I_{c7}$) through Q7. However Q4 and Q6 are turned-on and conduct equal currents. The collector current ($I_{c4}$) of Q4 flows into node 21 and the collector current ($I_{c6}$) of Q6 flows into node 25. The current $I_{R3}$ flowing via R3 into node 23 which is defined as the input of the current mirror is equal to $I_{c4}$ plus $I_{b8}$. However, $I_{b8}$ may be neglected as demonstrated below.

The base current ($I_{b4}$) out of the base of Q4 is equal to the collector current ($I_{c4}$) of Q4 divided by the $\beta$ of Q4. The base current ($I_{b6}$) out of the base of Q6 is equal to the collector current ($I_{c6}$) of Q6 divided by the $\beta$ of Q6. The emitter current $I_{c8}$ of Q8 is equal to $I_{b4} + I_{b6}$ and its base current $I_{b8}$ is equal to $[I_{b4} + I_{b6}]/(\beta + 1)$. Assuming $I_{b4}$ to be equal to $I_{b6}$, $I_{b8}$ is then approximately equal to $(2I_{c4})/\beta^2$. Assuming $\beta$ to be greater than 10, it is evident that $I_{b8}$ is very small compared to $I_{c4}$ and may be neglected.

Hence, for $V_{IN}$ greater than $V_O$, $I_{c4}$ is approximately equal to the current ($I_{R3}$) through R3. The value of $I_{R3}$ may be determined as follows:

$$I_{R3} = (V_{IN} - 3V_{BE})/R3 \qquad \text{eq. 1}$$

where the $3V_{BE}$ term includes the $V_{BE}$ of Q4, Q8 and Q10 (or Q11); and R3 is the ohmic value of R3.

The current $I_{R3}$ flows into node 23 to which are connected the bases of Q10 sand Q11 and the collector of Q10. Since Q11 is one-half the size of Q10, the collector current $I_{c11}$ that can flow through Q11 is one-half $I_{R3}$, and this current is drawn (or sunk) out of node 25. Q4 and Q6 are assumed to be of similar size whereby they both carry similar currents for the same bias conditions. Hence, for the condition just described, $I_{c6}$, which has an amplitude essentially equal to $I_{R3}$, flows (or is sourced) into current summing node 25. At the same time, current $I_{c11}$ which is essentially one half the value of $I_{R3}$ flows out of node 25. As a result, a net base current ($I_{b12}$), equal to ($I_{c6} - I_{c11}$), and having a value of one-half $I_{R3}$ then flows into the base of Q12. Q12 can then draw a collector current $I_{c12}$ out of node 27 which is beta times $I_{b12}$. Since Q7 is turned-off, Q12 is driven into saturation and clamps the bases of Q13 and Q18 at, or close to, ground potential ensuring that Q13 and Q18 are turned-off. With Q13 turned-off, the current $I_{R2}$, drawn via Q2 and R2, flows directly into the base of Q3. The latter is turned-on and its collector current $I_{R1}$ is then drawn out of the base of Q1 ensuring that Q1 is switched on and that $V_{IN}$ is tightly coupled to the load. With Q18 turned-off, it has no control over the conductivity of Q22 and Q23. With Q18 turned-off, the overvoltage comparator 22 can control the turn-on and turn-off of Q23 which in turn controls the turn-on and turn-off of Q22. The above describes the normal operation of the circuit when $V_{IN}$ is greater than $V_O$.

When $V_{IN}$ drops below $V_O$, the voltage at node 19 is now equal to $[V_O - V_{BE}]$ volts and, since $V_O$ is greater than $V_{IN}$, there is decreased conduction in Q4 and Q6 relative to conduction in Q5 and Q7. Assume for the following discussion that $V_{IN}$ is sufficiently below $V_O$, whereby Q4 and Q6 are rendered non-conducting while Q5 and Q7 are conducting. For this assumed condition ($I_{c4}$ and $I_{c6}$ are zero), Q5 conducts and its collector current ($I_{c5}$) flows into node 21 and via R3 into the base and collector of Q10 and the base of Q11. The current $I_{R3}$ is now equal to:

$$[V_O - 3V_{BE}]/R3 \qquad \text{eq. 2}$$

$I_{R3}$ flows into the collector and base of Q10 and into the base of Q11. As before, Q11 mirrors the current flowing in Q10, but, since Q11 is one-half the physical size of Q10, the collector current $I_{c11}$ of Q11 out of node 25 is approximately one-half $I_{R3}$. But in sharp contrast to the condition when $V_{IN}$ is greater than $V_O$, the current $I_{c6}$ into node 25 is now at, or close to, zero since Q6 is turned-off. Q11 is now driven into saturation and clamps the base of Q12 to ground ensuring the turn-off of Q12. Q7 is turned-on and supplies a current $I_{c7}$, which is approximately equal to $I_{c5}$ or $I_{R3}$, into node 27. With Q12 turned-off and with Q7 turned on, all of $I_{c7}$ flows into the bases of Q13 and Q18. It is advantageous to have Q13 and Q18 driven by a current $I_{c7}$ derived from $V_O$, when $V_O$ is greater than $V_{IN}$. The base current ($I_{b13}$) into Q13 is multiplied by the Beta of Q13 producing a collector current ($I_{c13}$) which is drawn out of node 17 and which turns off Q3. When Q3 is turned-off, there is no base drive to Q1 and Q1 is turned-off interrupting the connection between $V_{IN}$ and the load. Thus, when $V_{IN}$ is lower than $V_O$, Q1 is turned-off and the load is decoupled from the input voltage source. Q18 is also turned on and produces a large collector current drawn out of node 24, turning-off Q23. The turn-off of Q23, removes the base drive to Q22, turning Q22 off. Q22 (which is turned-on to turn-off Q1 when $V_{IN}$ exceeds a "safe" value) is now turned-off, when $V_O$ is greater than $V_{IN}$, to prevent feed-through in the "reverse direction" from terminal 15, via the collector base junction of Q1 and via the collector-to-emitter conduction path of Q22 into terminal 11.

It will now be demonstrated that the transition point at which Q1 is turned-off occurs when $V_{IN}$ is equal to $V_O$. When $V_{IN}$ is equal to $V_O$, the base-to-emitter voltages across Q4, Q5, Q6 and Q7 are equal and consequently they all conduct equal or nearly equal currents. For this condition the current $I_{R3}$ into resistor R3 is equal to the sum of $I_{c4}$ and $I_{c5}$ with $I_{c4}$ and $I_{c5}$ being equal to each other. As already discussed above the ratio of Q11 and Q10 dictates that the collector current $I_{c11}$ of Q11 is equal to one-half the collector current $I_{c10}$ and approximately equal to one-half $I_{R3}$. Since $I_{R3}$ is equal to the sum of $I_{c4}$ and $I_{c5}$, $I_{c11}$ is equal to approximately one-half $I_{c4}$ and $I_{c5}$. Hence, the current $I_{c6}$ into node 25 is essentially equal to $I_{c4}$, while the current $I_{c11}$ drawn out of node 25 is essentially equal to one-half $I_{c4}$ plus $I_{c5}$. Since $I_{c5}$ is equal to $I_{c4}$, $I_{c11}$ drawn out of node 25 is also essentially equal to $I_{c4}$. Therefore, for the condition of $V_{IN} = V_O$, the current ($I_{b12}$) into the base of Q12 which is equal to $I_{c6} - I_{c11}$ is essentially zero, and Q12 is non-conducting. However Q7 is turned on and conducting a current $I_{c7}$ into summing node 27. Since Q12 is non-conducting, all of $I_{c7}$ flows into the bases of transistors Q13 and Q18, these two transistors are then turned-on and can draw an amplified current in their collector-to-emitter paths. Thus, when $V_{IN}$ equals $V_O$, Q13 turns-on which turns off Q3 and Q1 and Q18 is also turned-on which turns-off Q23 and Q22.

A significant aspect of the invention is best appreciated by examining the response of the circuit for small changes of $V_{IN}$ and $V_O$ departing from the condition $V_{IN} = V_O$.

The current $I_{c11}$ drawn out of summing node 25 is approximately equal to $\frac{1}{2}[I_{c4} + I_{c5}]$ which is approximately equal to one-half of $I_{R3}$. The current $I_{R3}$ varies in a linear fashion as a function of $V_{IN}$ and/or $V_O$. That is, $I_{R3}$ is equal to $[V_{IN} - 3V_{BE}]/R3$ if $V_{IN} > V_O$ or $[V_O - 3V_{BE}]/R3$ if $V_O > V_{IN}$.

Thus, although $I_{R3}$ is the sum of $I_{c4}$ and $I_{c5}$ whenever $V_{IN}$ changes very little with respect to $V_O$ or $V_O$ changes very little with respect to $V_{IN}$, $I_{R3}$ changes very little although $I_{c4}$ and $I_{c5}$ may change considerably. By summing $I_{c4}$ and $I_{c5}$ a current $I_{c10}$ is produced in which the variations in $I_{c4}$ and $I_{c5}$ are essentially masked since when one of $I_{c4}$ and $I_{c5}$ decreases, the other one of $I_{c4}$ and $I_{c5}$ increases. $I_{c10}$ is mirrored to produce $I_{c11}$ which is the average of $I_{c4}$ and $I_{c5}$, and $I_{c11}$ is drawn (or sunk) out of summing node 25. The current $I_{c6}$ supplied (or sourced) into node 25 varies exponentially in response to changes of $V_{IN}$ relative to $V_O$. Consequently, the difference current ($I_{c6} - I_{c11}$) or signal generated at summing node 25 is not a linear signal representing the difference between two linearly varying currents.

Rather it is the difference between one current which varies linearly and another current which changes exponentially. This enables relatively large signals to be produced for very small changes in $V_{IN}$ relative to $V_O$.

This is best illustrated with reference to FIG. 3 which is a simplified schematic diagram of the comparator circuit of FIG. 2. Assume by way of example that $V_{IN}=V_O=5$ volts. Assume also that the $V_{BE}$ of each transistor is 0.7 volt and that R3 is equal to 50K ohms and that temperature is equal to 25° C. The value of $I_{R3}$ is then set at some value identified to herein as $I_{R3F}$. For the condition of $V_{TN}=V_O$, $I_{c4}=I_{c5}=I_{c6}=\frac{1}{2} I_{R3F}$. Since $I_{c10}$ is equal to $I_{R3F}$, $I_{c11}$ is equal to $\frac{1}{2} I_{R3F}$ and, hence, $I_{b12}=0$. For $V_{IN}=V_O=5$ volts, $I_{c4}=I_{c5}=I_{c11}=I_{c6}=29$ microamperes, $I_{R3}=58$ microamperes, and $I_{b12}$ is zero, as set forth in Table I, below.

However it can now be shown that for a small change in $V_{IN}$ or a small change in $V_O$, $I_{c6}$ changes dramatically whereas $I_{c11}$ remains relatively constant.

For example, assume that $V_{IN}$ goes more positive than $V_O$ by 24 millivolts. As $V_{IN}$ goes 24 millivolts positive relative to $V_O$ the conductivity of Q4 and Q6 is increased while the conductivity of Q5 is decreased. The current $I_{c4}$ through Q4 and $I_{c6}$ through Q6 may now be assumed to be equal to twice the value of the current flowing through Q5.

However, note that the current $I_{R3}$ changes very little since $I_{R3}$ is now equal to $[I_{R3F}+24\text{ mv}/R3]$ where R3 is, for example, 50K ohms, the change in $I_{R3}$ is very small. Since $I_{R3}$ does not change perceptively, $I_{c11}$ remains essentially equal to $\frac{1}{2} I_{R3F}$. However, the current flowing through Q6 has changed from a value equal to $\frac{1}{2} I_{R3F}$ when $V_{IN}$ is equal to $V_O$ to a value equal to $\frac{2}{3} I_{R3}$ when $V_{IN}$ exceeds $V_O$ by 24 millivolts. Hence $I_{b12}$ is now equal to $1/6 I_{R3}$. For the values assumed above and as set forth in Table 1 below, $I_{c4}$ and $I_{c6}$ would equal 38.99 microamperes, $I_{R3}$ would be 58.48 microamperes, $I_{c11}$ would equal 29.24 microamperes and $I_{b12}$ would be essentially equal to 9.75 microamperes.

collector to a node 39 to which is connected the collector of an NPN transistor Q111 whose base is connected to node 23 and whose emitter is grounded. Assuming Q111 to be similar to Q11 the current $I_{c111}$ through Q111 would be similar to $I_{c11}$. The difference current $I_{d39}$, equal to $I_{c71}$ minus $I_{c111}$, produced at node 39 would have complementary values to the difference current ($I_{b12}$) produced at node 25, as set forth in Table 1.

Figure 3:
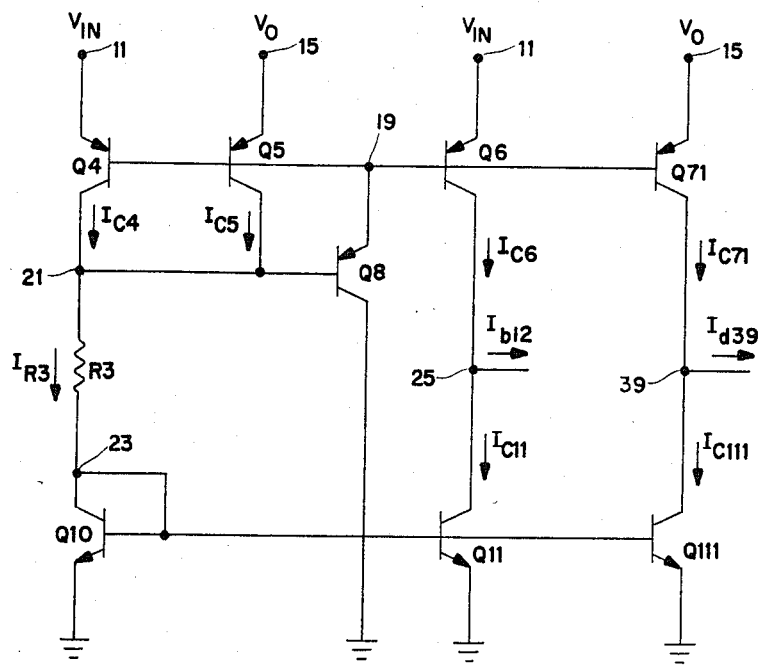
FIG. 3 is a simplified schematic diagram of comparator circuitry embodying the invention.
Figure 4:
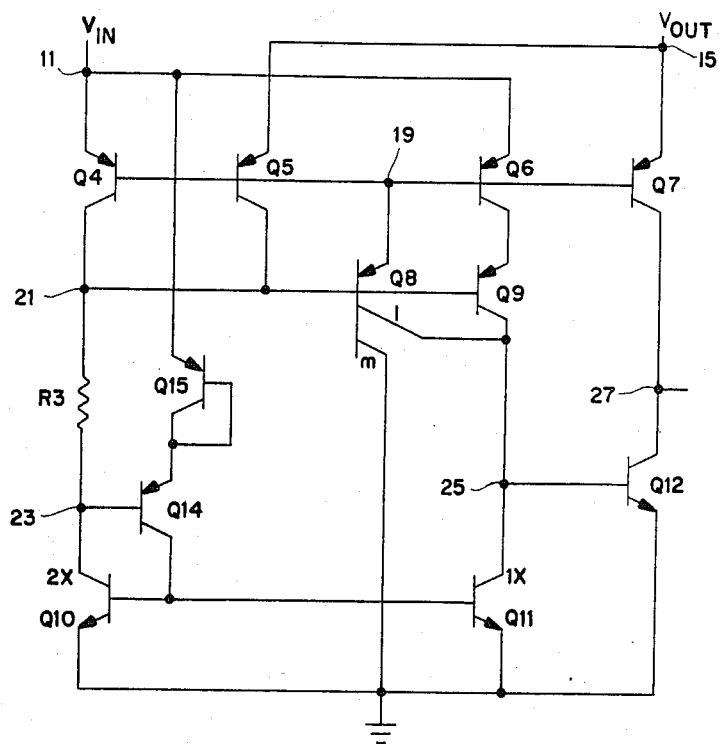
FIG. 4 is a more detailed schematic diagram of comparator circuitry embodying the invention.

The circuit of FIG. 4 includes a PNP bipolar transistor Q15 and a PNP bipolar transistor Q14 which may be added to the circuit of FIG. 3 to minimize the errors caused by the base currents in Q10 and Q11. Also included in FIG. 4 is a PNP transistor Q9 which keeps the collector voltage of Q6 within a $V_{BE}$ of the Q4 and Q5 collector voltages to minimize errors caused by the PNP device output impedance. A fraction of the collector current in Q8 is added to the collector current in Q9 to make the current into node 25 equal to the current $I_{R3}/2$ at the switch point when $V_O=V_{IN}$. Q8 may be made with two separate collector regions, whose sizes may have a predetermined ratio to provide a current into node 25 which is a ratio of the emitter current of Q8.

Returning to FIG. 1, there is shown an insulated-gate field-effect transistor (IGFET), P1, whose source is connected to output terminal 15, whose drain is connected to the base of Q1 and whose control electrode is connected to input terminal 11. P1, as connected, also functions to turn-off transistor Q1 when (due to a negative going transient or like cause) the input voltage, $V_{IN}$, goes negative relative to the output voltage, $V_O$, by more than the threshold voltage ($V_T$) of P1.

The current limiting circuit shown in FIG. 1 functions to sense when the emitter-to-collector current of Q1 exceeds a given value and to then decrease the conductivity of Q1 to limit the emitter-to-collector current, $I_O$, through Q1.

The thermal limiting circuit shown in FIG. 1 func-

TABLE I

| | $I_{c4}$ | $I_{c5}$ | $I_{R3}$ | $I_{c11}$ | $I_{c6}$ | $I_{b12}$ | $I_{c71}$ | $I_{d39}$ |
|---|---|---|---|---|---|---|---|---|
| $V_{IN}=V_0=5v$ | $\frac{1}{2} I_{R3F}$ | $\frac{1}{2} I_{R3F}$ | $\frac{5v - 3V_{be}}{R_3} = I_{R3F}$ | $\frac{1}{2} I_{R3F}$ | $\frac{1}{2} I_{R3F}$ | 0 | $\frac{1}{2} I_{R3F}$ | 0 |
| | 29 microAmp | 29 microAmp | 58 microAmp | 29 microAmp | 29 microAmp | | 29 microAmp | |
| $V_{IN}>V_0$ | $I_{c4}=2I_{c5}$ | $I_{c5}=\frac{1}{3} I_{R3}$ | $\approx I_{R3F}$ | $\approx \frac{1}{2} I_{R3F}$ | $\frac{2}{3} I_{R3}$ | $\frac{1}{6} I_{R3}$ | $\frac{1}{3} I_{R3}$ | $-\frac{1}{6} I_{R3}$ |
| $V_{IN}=5.024v$ $V_0=5.0v$ | $I_{c4}=\frac{2}{3} I_{R3}$ 38.99 microAmp | 19.49 microAmp | 58.48 microAmp | 29.24 microAmp | 38.99 microAmp | 9.75 microAmp | 19.49 microAmp | −9.75 microAmp |
| $V_0>V_{IN}$ | $I_{c4}=\frac{1}{3} I_{R3}$ | $I_{c5}=\frac{2}{3} I_{R3}$ | $\approx I_{R3F}$ | $\approx \frac{1}{2} I_{R3F}$ | $\frac{1}{3} I_{R3}$ | $-\frac{1}{6} I_{R3}$ | $\frac{2}{3} I_{R3}$ | $\frac{1}{6} I_{R3}$ |
| $V_0=5.024v$ $V_{IN}=5.0v$ | 19.49 microAmp | 38.99 microAmp | 58.48 microAmp | 29.24 microAmp | 19.49 microAmp | −9.75 microAmp | 38.99 microAmp | 9.75 microAmp |

In a similar manner, if $V_O$ increases relatively to $V_{IN}$ by an amount equal to 24 millivolts. $I_{c5}$ increases twice the value of $I_{c4}$ or $I_{c6}$ while $I_{R3}$ remains essentially equal to its previous value of $I_{R3F}$ and $I_{c11}$ remains essentially equal to $\frac{1}{2} I_{R3F}$. However, $I_{c4}$ is now equal to $\frac{1}{3} I_{R3}$ and $I_{c5}$ is equal to $\frac{2}{3} I_{R3}$. Hence, a net current essentially equal to $1/6 I_{R3}$ is drawn out of node 25.

FIG. 3 also shows a PNP transistor Q71 connected at its emitter to terminal 15, at its base to node 19 and at its tions to decrease the current drive to Q1 when the chip temperature exceeds a predetermined value.

What is claimed is:

1. The combination comprising:
    first and second nodes for application thereto of a first and a second voltage, respectively;

first, second, and third transistors, each one of said first, second and third transistors having an input electrode and an output electrode defining the ends of a main conduction path and a control electrode;

means connecting the input electrode of said first transistor to said first node;

means connecting the input electrode of said second transistor to said second node;

means connecting the input electrode of said third transistor to one of said first and second nodes;

means connecting the control electrodes of said first, second and third transistors to a common biasing node;

means connecting the output electrodes of said first and second transistors in common at a first summing node for producing a first current into said first summing node which is the sum of the currents in said first and second transistors; and current mirror means having an input connected to said first summing node and having an output connected to the output electrode of said third transistor at a second summing node for producing at said second summing node a current which is the difference between the current flowing in the output electrode of said third transistor and a current proportional to said first current flowing in said output of said current mirror means.

2. The combination as claimed in claim 1 further including:

(a) a fourth transistor having an input electrode, an output electrode and a control electrode; means connecting the input electrode of said fourth transistor to the other one of said first and second nodes than the one to which the input electrode of said third transistor is connected; means connecting the control electrode of said fourth transistor to said common biasing node; and means connecting the output electrode of said fourth transistor to a third summing node; and (b) a fifth transistor having an output electrode connected to said third summing node, a control electrode connected to said second summing node, and an input electrode connected to a point of reference potential.

3. A comparator comprising:

first and second nodes for the application thereto of first and second voltages, respectively;

first and second means coupled between said first and second nodes, each means being responsive to the difference between said first and second voltages; said first means for producing a first current which increases exponentially as said first voltage increases above said second voltage, and said second means for producing a second current which increases exponentially as the second voltage increases above the first voltage;

a current mirror means combining said first and second currents for producing a combined current which is a linear function of that one of said first and second voltages having the greater amplitude;

means for generating a like current to one of said first and second currents and summing it with a current proportional to said combined current for producing at a first output terminal a difference current having one value when said first voltage is greater than said second voltage and having another value when said first voltage is equal to or less than said second voltage.

4. The combination comprising:

an input terminal for the application thereto of a driving voltage;

an output terminal for the connection thereto of load means;

selectively enabled switch means coupled between said input and output terminals for, when enabled, coupling said driving voltage to said output terminal;

comparator means responsive to the voltages at said input and output terminals for producing a first current indicative of the level of said driving voltage and a second current indicative of the level of said output voltage; said means including current summing means responsive to said first and second currents for producing a signal current having a first value when said driving voltage is greater than said output voltage, and having a second value when said driving voltage is less than said output voltage; and control means coupled between said current summing means and said selectively enabled switch means responsive to said signal current for disabling said selectively enabled switch means when said signal current has said second value.

5. The combination as claimed in claim 4 wherein said comparator means includes:

(a) first, second, third and fourth transistors, each transistor having a main conduction path and a control electrode; said first and second transistors having one end of their conduction paths connected to said input terminal, each one of said first and second transistors for producing a first current proportional to the level of $V_{IN}$; said third and fourth transistors having one end of their conduction paths connected to said output terminal, each one of said third and fourth transistors for producing a second current proportional to the level of $V_O$;

(b) a common biasing means connected to the control electrodes of said first, second, third and fourth transistors for causing said first and second transistors to conduct more than said third and fourth transistors when $V_{IN}$ is greater than $V_O$ and for causing said third and fourth transistors to conduct more than said first and second transistors when said $V_{IN}$ is less than said $V_O$; and (c) a current mirror means having an input to which is supplied the currents of said first and third transistors and having an output at which is produced a current proportional to the sum of the currents of said first and third transistors; and wherein said current summing means includes a summing node connected to the output of said current mirror means and to the other end of the conduction path of said second transistor for producing said signal current.

6. The combination comprising:

an input terminal for the application thereto of a driving voltage;

an output terminal for the connection thereto of load means;

selectively enabled switch means coupled between said input and output terminals for, when enabled, coupling said driving voltage to said output terminal;

comparator means responsive to the voltage at said input and output terminals for disabling said switch means when the voltage ($V_{IN}$) at said input terminal drops below the voltage ($V_O$) at said output terminal, comprising:

first means responsive to the voltage at said input terminal for producing a first current indicative of the level of said driving voltage;

second means responsive to the voltage at said output terminal for producing a second current indicative of the level of said output voltage;

current summing means coupled to said first and second means responsive to said first and second currents for producing a signal current having a first value when said driving voltage is greater than said output voltage, and having a second value when said driving voltage is less than said output voltage; and control means coupled between said current summing means and said selectively enabled switch means responsive to said signal current for disabling said selectively enabled switch means when said signal current has said second value.

7. The combination comprising:

an input terminal for the application thereto of a driving voltage;

an output terminal for the connection thereto of load means;

selectively enabled switch means coupled between said input and output terminals for, when enabled, coupling said driving voltage to said output terminal comparator means responsive to the voltage at said input and output terminals for disabling said switch means when the voltage ($V_{IN}$) at said input terminal drops below the voltage ($V_O$) at said output terminal, comprising:

(a) first, second, third and fourth transistors, each transistor having a main conduction path and a control electrode;

(b) said first and second transistors having one end of their conduction paths connected to said input terminal, each one of said first and second transistors for producing a first current indicative of the level of $V_{IN}$;

(c) said third and fourth transistors having one end of their conduction paths connected to said output terminal, each one of said third and fourth transistors for producing a second current indicative of the level of $V_O$;

(d) a common biasing means connected to the control electrodes of said first, second, third and fourth transistors for causing said first and second transistors to conduct more than said third and fourth transistors when $V_{IN}$ is greater than $V_O$ and for causing said third and fourth transistors to conduct more than said first and second transistors when said $V_{IN}$ is less than said $V_O$; and (e) a current mirror means having an input to which is supplied the currents of said first and third transistors and having an output at which is produced a current proportional to the sum of the currents of said first and third transistors; and (f) a summing node connected to the output of said current mirror means and to the other end of the conduction path of said second transistor for producing a signal current which is the difference between a current proportional to $V_{IN}$ and a current proportional to $V_O$ whereby when $V_{IN}$ is greater than $V_O$ said signal current has one value and when $V_{IN}$ is less than $V_O$ said signal current has another value; and means coupled between said summing node and said selectively enabled switch means responsive to said signal current for disabling said switch means when said signal current has said another value and $V_{IN}$ is equal to or less than $V_O$.

* * * * *

UNITED STATES PATENT AND TRADEMARK OFFICE
CERTIFICATE OF CORRECTION

PATENT NO. : 4,680,483

DATED : Jul. 14, 1987

INVENTOR(S) : R. L. Giordano

It is certified that error appears in the above-identified patent and that said Letters Patent is hereby corrected as shown below:

Col. 3, line 2, after "equal" insert --to--.

Col. 4, line 24, after "with" insert --the--.

Col. 7, line 12, delete "$V_{TN}$" and insert --$V_{IN}$--.

Col. 9, line 60, (Claim 3) after "amplitude;" insert --and--.

Col. 9, line 61, (Claim 3) delete "a like" and insert --an exponential--.

Col. 9, line 61, delete "to" and insert --like--.

Col. 10, line 46, (Claim 5) after "more" delete "than".

Col. 10, line 48, (Claim 5) after "current" insert --summing means including a current--.

Col. 11, lines 29-30, (Claim 7) after "terminal" insert --;--.

Signed and Sealed this

Thirty-first Day of May, 1988

*Attest:*

DONALD J. QUIGG

*Attesting Officer*  *Commissioner of Patents and Trademarks*